United States Patent
Iwasaki

(10) Patent No.: US 9,136,491 B2
(45) Date of Patent: Sep. 15, 2015

(54) ORGANIC ELECTROLUMINESCENT ELEMENT AND METHOD FOR PRODUCING THE SAME

(75) Inventor: Masataka Iwasaki, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 1179 days.

(21) Appl. No.: 13/060,785

(22) PCT Filed: Aug. 14, 2009

(86) PCT No.: PCT/JP2009/064332
§ 371 (c)(1),
(2), (4) Date: Apr. 20, 2011

(87) PCT Pub. No.: WO2010/024136
PCT Pub. Date: Mar. 4, 2010

(65) Prior Publication Data
US 2011/0186833 A1 Aug. 4, 2011

(30) Foreign Application Priority Data
Aug. 27, 2008 (JP) ................................ 2008-217828

(51) Int. Cl.
*H01L 51/00* (2006.01)
*H01L 51/50* (2006.01)
*H01L 51/56* (2006.01)

(52) U.S. Cl.
CPC ............ *H01L 51/5012* (2013.01); *H01L 51/56* (2013.01); *H01L 51/004* (2013.01); *H01L 51/0026* (2013.01); *H01L 51/0036* (2013.01); *H01L 51/0038* (2013.01)

(58) Field of Classification Search
USPC ........................................................ 427/74
See application file for complete search history.

(56) References Cited

U.S. PATENT DOCUMENTS

| 6,776,880 B1 | 8/2004 | Yamazaki |
| 2002/0034930 A1 | 3/2002 | Yamazaki et al. |

(Continued)

FOREIGN PATENT DOCUMENTS

| CN | 1188014 C | 2/2005 |
| CN | 1691845 A | 11/2005 |

(Continued)

OTHER PUBLICATIONS

Notification of Reasons for Rejection issued May 28, 2013 for Japanese Patent Application No. 2008-217828 with English translation.

(Continued)

*Primary Examiner* — Robert Vetere
(74) *Attorney, Agent, or Firm* — Sughrue Mion, PLLC

(57) ABSTRACT

The problem to be solved by the present invention is to prolong the luminance half life of an organic EL element. A means for solving the problem is a method for producing an organic electroluminescent element comprising a first electrode that is formed first, a second electrode that is formed later, and a light-emitting layer that is formed between the first electrode and the second electrode, the method comprising the steps of applying a solution containing a light-emitting organic material to a surface of a layer located below to form an applied film; calcining the applied film in an inert gas atmosphere or in a vacuum atmosphere to form a light-emitting layer; holding the surrounding of the formed light-emitting layer in an inert gas atmosphere or in a vacuum atmosphere; and forming a layer located on the light-emitting layer in an inert gas atmosphere or in a vacuum atmosphere.

10 Claims, 1 Drawing Sheet

(56) References Cited

U.S. PATENT DOCUMENTS

| | | |
|---|---|---|
| 2002/0064966 A1 | 5/2002 | Seki et al. |
| 2002/0187255 A1 | 12/2002 | Yi et al. |
| 2005/0005850 A1* | 1/2005 | Yamazaki .................... 118/719 |
| 2005/0136288 A1 | 6/2005 | Lee et al. |
| 2005/0147842 A1 | 7/2005 | Hirayama et al. |
| 2005/0147843 A1* | 7/2005 | Kobayashi et al. ........... 428/690 |
| 2005/0197031 A1 | 9/2005 | Yamazaki et al. |
| 2005/0243122 A1* | 11/2005 | Usuda ............................ 347/29 |
| 2008/0007164 A1 | 1/2008 | Suzuki et al. |
| 2008/0100206 A1 | 5/2008 | Kondo et al. |

FOREIGN PATENT DOCUMENTS

| | | |
|---|---|---|
| CN | 1825565 A | 8/2006 |
| EP | 0792089 A2 | 8/1997 |
| EP | 1058314 A2 | 12/2000 |
| EP | 1071117 A2 | 1/2001 |
| JP | 2001-052864 A | 2/2001 |
| JP | 2001-102170 A | 4/2001 |
| JP | 2002-216570 A | 8/2002 |
| JP | 2002-313567 A | 10/2002 |
| JP | 2003-137932 A | 5/2003 |
| JP | 2003-173871 A | 6/2003 |
| JP | 2004-355913 A | 12/2004 |
| JP | 2005-259720 A | 9/2005 |
| JP | 2005-310639 A | 11/2005 |
| JP | 2005-322436 A | 11/2005 |
| JP | 2007-149589 A | 6/2007 |
| JP | 2007-214007 A | 8/2007 |
| JP | 2008-071726 A | 3/2008 |
| KR | 2008-0004381 A | 1/2008 |
| TW | I239220 B | 9/2005 |
| TW | I262739 B | 9/2006 |
| WO | 2006/070713 A1 | 7/2006 |

OTHER PUBLICATIONS

International Preliminary Report on Patentability for corresponding International Patent Application No. PCT/JP2009/064332 mailed Apr. 21, 2011.
Office Action issued Sep. 18, 2012 in Japanese Patent Application No. 2008-217828 to Sumitomo Chemical Co., Ltd., with translation.
Office Action issued Jan. 10, 2013 in European Patent Application No. 09809789.2 to Sumitomo Chemical Co., Ltd.
Second Office Action issued Mar. 5, 2013 in Chinese Patent Application No. 2009801333450.5 to Sumitomo Chemical Co., Ltd., with English translation.
Extended European Search Report issued Sep. 14, 2011 in European Patent Application No. 09809789.2 to Sumitomo Chemical Co., Ltd.
Office Action issued Aug. 27, 2012 in Chinese Patent Application No. 200980133450.5 to Sumitomo Chemical Co., Ltd., with English translation.
Decision to Dismiss an Amendment issued Oct. 8, 2013 in corresponding Japanese Patent Application No. 2008-217828 with English translation.
Office Action issued Oct. 6, 2014 in corresponding Taiwanese Patent Application No. 098128457 with English translation.
Office Action issued Mar. 30, 2015 in corresponding Taiwanese Patent Application No. 98128457 with translation.
Office Action dated Jul. 16, 2015 issued in Korean Patent Application No. 2011-7004388 with English translation.

* cited by examiner

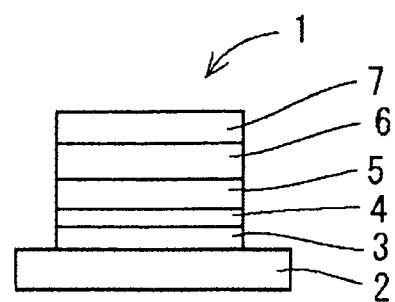

ORGANIC ELECTROLUMINESCENT ELEMENT AND METHOD FOR PRODUCING THE SAME

CROSS REFERENCE TO RELATED APPLICATIONS

This application is a National Stage of International Application No. PCT/JP2009/064332 filed Aug. 14, 2009, claiming priority based on Japanese Patent Application No. 2008-217828 filed Aug. 27, 2008, the contents of all of which are incorporated herein by reference in their entirety.

TECHNICAL FIELD

The present invention relates to an organic electroluminescent element, a method for producing the same, a planar light source, a lighting device, and a display device.

BACKGROUND ART

An organic electroluminescent (hereinafter, sometimes referred to as "organic EL") element is constituted by comprising an anode, a cathode, and an organic light-emitting layer containing a light-emitting organic material. When a voltage is applied to an organic EL element, holes are injected from an anode and electrons are injected from a cathode, and then the injected holes and electrons are recombined in a light-emitting layer, so that the organic EL element emits light.

Organic EL elements have an advantage that their production step is simple and they can easily afford a large area, because organic layers such as light-emitting layers can be formed by an applying method. Specifically, an organic light-emitting layer can be formed by applying an organic solution containing a light-emitting organic material to form a film and then calcining the formed applied film. For example, for conventional organic EL elements, an organic light-emitting layer is formed by performing calcination of an applied film in a nitrogen atmosphere, and after transfer to a vacuum deposition machine, a cathode is formed (see, for example, Patent Document 1).

Patent Document 1: Japanese Patent Laid-Open Publication No. 2005-259720

DISCLOSURE OF THE INVENTION

Problems to be Solved by the Invention

However, conventional organic EL elements do not necessarily have enough duration of light emission.

Then, an object of the present invention is to prolong the duration of light emission, especially luminance half life, of an organic EL element.

Means for Solving the Problems

The present invention provides a method for producing an organic electroluminescent element comprising a first electrode that is formed first, a second electrode that is formed later, and a light-emitting layer that is formed between the first electrode and the second electrode, the method comprising the steps of:

applying a solution containing a light-emitting organic material to a surface of a layer located below to form an applied film;

calcining the applied film in an inert gas atmosphere or in a vacuum atmosphere to form a light-emitting layer;

holding the surrounding of the formed light-emitting layer in an inert gas atmosphere or in a vacuum atmosphere; and forming a layer located on the light-emitting layer in an inert gas atmosphere or in a vacuum atmosphere.

In one embodiment, the step of applying a solution containing a light-emitting organic material to form an applied film is performed in an inert gas atmosphere.

In one embodiment, the step of calcining the applied film to form a light-emitting layer is performed in a vacuum atmosphere.

In one embodiment, there is further comprised the step of forming a layer in an inert gas atmosphere or in a vacuum atmosphere after the layer located on the light-emitting layer is formed until the second electrode is formed, while the surrounding of the layers to be formed including a layer located on the light-emitting layer being held in an inert gas atmosphere or in a vacuum atmosphere.

In one embodiment, the layer located on the above-mentioned organic light-emitting layer is the second electrode.

In one embodiment, the above-mentioned light-emitting organic material comprises a light-emitting macromolecular compound.

In one embodiment, the light-emitting macromolecular compound is at least one kind selected from the group consisting of polyparaphenylene vinylene derivatives, polythiophene derivatives, polyparaphenylene derivatives, polysilane derivatives, polyacetylene derivatives, polyfluorene derivatives, and polyvinylcarbazole derivatives.

In one embodiment, the light-emitting macromolecular compound is at least one kind selected from the group consisting of polyvinylcarbazole derivatives, polyparaphenylene derivatives and polyfluorene derivatives as materials that emit blue light; polyparaphenylene vinylene derivatives and polyfluorene derivatives as materials that emit green light; polyparaphenylene vinylene derivatives, polythiophene derivatives and polyfluorene derivatives as materials that emit red light.

In one embodiment, there is further comprised, before the step of applying a solution containing a light-emitting organic material to form an applied film, as a method of forming a layer located below the light-emitting layer, the step of;

applying a solution containing a functional organic material to a surface of a layer located below to form an applied film; and calcining the applied film in an inert gas atmosphere or in a vacuum atmosphere to form a functional layer.

In one embodiment, there is further comprised the step of holding the surrounding of the formed functional layer in an inert gas atmosphere or in a vacuum atmosphere.

In one embodiment, the first electrode is an anode, the second electrode is a cathode, and the above-mentioned functional organic material contains a hole transporting macromolecular compound.

In one embodiment, the above-mentioned hole transporting macromolecular compound is at least one kind selected from the group consisting of polyvinylcarbazole or its derivatives, polysilane or its derivatives, polysiloxane derivatives having an aromatic amine compound group in their side chain or main chain, polyaniline or its derivatives, polythiophene or its derivatives, polyarylamine or its derivatives, poly(p-phenylenevinylene) or its derivatives, and poly(2,5-thienylenevinylene) or its derivatives.

Moreover, the present invention provides an organic electroluminescent element produced by any one of the above-mentioned methods for producing an organic electroluminescent element.

Moreover, the present invention provides a planar light source, a display device, or a lighting device each comprising the above-mentioned organic electroluminescent element.

Effect of the Invention

According to the present invention, an organic EL element having a long luminance half life is realized. Moreover, a planar light source, a lighting device, and a display device that are good in life characteristics are realized by equipping with an organic EL element with a long element life.

BEST MODE FOR CARRYING OUT THE INVENTION

An organic EL element usually has a first electrode that is provided on a substrate and is formed first, a second electrode that is formed later, and an organic light-emitting layer that is formed between the first electrode and the second electrode. The first electrode is one of an anode and a cathode, the second electrode is the other of the anode and the cathode, and when the organic EL element is formed on a substrate 2, the first electrode is usually arranged closer to the substrate 2 than the second electrode.

FIG. 1 is a sectional view that schematically illustrates the structure of an organic EL element that is one embodiment of the present invention. In this organic EL element, the first electrode is an anode 3, the second electrode is a cathode 7, and an organic light-emitting layer 6 is provided between the anode 3 and the cathode 7. As described below, prescribed layers are provided according to need between the anode 3 and the organic light-emitting layer 6 and/or between the organic light-emitting layer 6 and the cathode 7. In this embodiment, a hole injection layer 4 and a hole transporting layer 5 are provided between the anode 3 and the organic light-emitting layer 6. That is, the organic EL element 1 of this embodiment is constituted in such a manner that the anode 3, the hole injection layer 4, the hole transporting layer 5, the organic light-emitting layer 6, and the cathode 7 are laminated in this order from the substrate 2.

In this specification, one side in the thickness direction of the substrate 2 (the upper side in FIG. 1) may be referred to as the upper side or the upper and the other side in the thickness direction of the substrate 2 (the lower side in FIG. 1) may be referred to as the lower side or the lower. That is, in the positional relation of a plurality of layers forming the organic EL element, a layer that is formed earlier is expressed to be the lower and a layer that is formed later is expressed to be the upper.

The organic EL element 1 is produced by laminating the anode 3, the hole injection layer 4, the hole transporting layer 5, the organic light-emitting layer 6, and the cathode 7 one after another on the substrate 2. Hereinafter, a method for producing the organic EL element 1 is described by taking the organic EL element illustrated in FIG. 1 as an example.

First, the substrate 2 is prepared. Next, the anode 3 is formed on the substrate 2. It is permissible to prepare a substrate 2 on which an anode 3 has been formed. Next, the hole injection layer 4 and the hole transporting layer 5 are laminated one after another on the anode 3. The details of the material and the like of the substrate 2, the anode 3, the hole injection layer 4, and the hole transporting layer 5 are described below.

Next, the organic light-emitting layer 6 is formed.

<Application Step>

An applied film is formed on the hole transporting layer 5 by an applying method using an application liquid containing a material to form the organic light-emitting layer 6, for example, a light-emitting organic material. Specifically, the above-mentioned application liquid is applied on the surface of the hole transporting layer 5, so that the applied film is formed. The atmosphere where the applied film is formed may be either the air or an atmosphere containing an inert gas, and an atmosphere containing an inert gas is preferred from the viewpoint of increasing the life of an organic EL element. Examples of the inert gas include helium gas, argon gas, nitrogen gas, and their mixed gases, and nitrogen gas is preferred among them from the viewpoints of the ease of element production and increasing the life. Such an inert gas is introduced into an apparatus in which an organic EL element is formed. The concentration, in a volume ratio, of the inert gas in the atmosphere is usually 99% or more, and preferably is 99.5% or more.

<Calcination Step>

Next, the applied film formed in the application step in the atmosphere containing an inert gas or a vacuum atmosphere is calcined. It is preferred to calcine the applied film in a vacuum atmosphere from the viewpoint of increasing the life of an organic EL element.

When the calcination is performed in a vacuum atmosphere, the degree of vacuum is usually 10000 Pa or less, preferably 100 Pa or less, more preferably 10 Pa or less, even more preferably 0.1 Pa or less, and particularly preferably 0.001 Pa or less.

Since the removal of the solvent residue, moisture and oxygen of the applied film is performed by calcination especially in a vacuum atmosphere in such a manner, an organic EL element with a long element life can be realized.

When the calcination is performed in an atmosphere containing an inert gas, examples of the inert gas include helium gas, argon gas, nitrogen gas, and their mixed gases, and nitrogen gas is preferred among them from the viewpoints of the ease of element production and increasing the life. Such an inert gas is introduced into an apparatus in which an organic EL element is formed. The concentration, in a volume ratio, of the inert gas in the atmosphere is usually 99% or more, and preferably is 99.5% or more. The solvent contained in the applied film is removed by this calcination step, so that the organic light-emitting layer 6 is formed.

From the viewpoint of the light-emitting characteristic and life characteristic of an element, it is preferred to perform the calcination at a temperature within the range of from 50° C. to 250° C. The calcination time is selected suitably depending on the component of the applied film and, for example, it is usually about 5 minutes to about 2 hours.

In this embodiment, the cathode 7 is formed on the organic light-emitting layer 6 after the organic light-emitting layer 6 is formed. An atmosphere containing an inert gas or a vacuum atmosphere is used as the atmosphere to be used from the time of the completion of the calcination of the applied film to the completion of the formation of the cathode 7. Specifically, the surrounding of the formed organic light-emitting layer 6 is held in an inert gas atmosphere or a vacuum atmosphere, and then the cathode 7 is formed in an inert gas atmosphere or a vacuum atmosphere.

The atmosphere to be used from the completion of the calcination of the applied layer to the completion of the formation of the cathode 7 is preferably a vacuum atmosphere from the viewpoint of the prolongation of the life of an organic EL element.

When the atmosphere to be used from the completion of the calcination of the applied layer to the completion of the formation of the cathode 7 is made to be a vacuum atmosphere, the degree of vacuum is usually 10000 Pa or less, preferably 100 Pa or less, more preferably 10 Pa or less, even more preferably 0.1 Pa or less, and particularly preferably 0.001 Pa or less.

When the atmosphere to be used from the completion of the calcination of the applied layer to the completion of the formation of the cathode 7 is made to be an atmosphere containing an inert gas, examples of the inert gas include helium gas, argon gas, nitrogen gas, and their mixed gases, and nitrogen gas is preferred among them from the viewpoints of the ease of element production and increasing the life. Such an inert gas is introduced into an apparatus in which an organic EL element is formed. The concentration, in a volume ratio, of the inert gas in the atmosphere is usually 99% or more, and preferably is 99.5% or more.

In a conventional art, since the calcined organic light-emitting layer 6 was thought to be stable, it was not thought that the life of an element was shortened through the exposure of the organic light-emitting layer 6 to the air. So, for example, in the case of forming the cathode 7 by vacuum deposition, the organic light-emitting layer 6 was exposed to the air when a substrate on which the organic light-emitting layer 6 had been formed was transferred to a vacuum deposition machine. The present inventors, however, has found that the life of an element becomes short with the organic light-emitting layer 6 exposed to the air. Therefore, in this embodiment, an atmosphere containing an inert gas or a vacuum atmosphere is used as the atmosphere for from the time of the completion of the calcination of the applied film to the completion of the formation of the cathode 7 to form the cathode 7 without exposing the organic light-emitting layer 6 to the air, and thereby, increasing the life of an organic EL element has been realized.

As described above, the organic EL element 1 with a long element life can be realized by forming the cathode 7 while holding a vacuum atmosphere or an inert gas atmosphere since the organic light-emitting layer 6 has been formed through the calcination step.

Although methods for forming the hole injection layer 4 and the hole transporting layer 5 are described below, it is preferred, in the case of forming each of the layers by an applying method, to form each of the layers in the same atmosphere as that in which the organic light-emitting layer 6 is formed. In particular, by forming a layer next to the organic light-emitting layer 6 (the hole transporting layer 5 in this embodiment) in the same atmosphere as that in which the organic light-emitting layer 6 is formed, it is possible to obtain the hole transporting layer 5 from which the solvent residue, moisture, and oxygen of the applied film have thoroughly been removed, and it is possible to reduce an adverse effect which the layer next to the organic light-emitting layer gives with time to the organic light-emitting layer 6, and therefore, it is possible to realize an organic EL element with a long element life. Moreover, in this case, it is preferred to use a vacuum atmosphere or an inert gas atmosphere as the atmosphere to be used from the formation of a prescribed layer (the hole injection layer 4 in this embodiment) on the anode 3 to the formation of the cathode 7, and this makes it possible to realize an organic EL element having a long element life.

Although the organic light-emitting layer 6 and the cathode 7 are formed so that they are in contact with each other in this embodiment, functional layers, such as an electron injection layer, an electron transporting layer, and a hole blocking layer, may be provided between the organic light-emitting layer and the cathode in another embodiment. In such an embodiment, the surrounding of the formed organic light-emitting layer is held in an inert gas atmosphere or a vacuum atmosphere, and then a layer located on the organic light-emitting layer in an inert gas atmosphere or a vacuum atmosphere is formed. Thus, an organic EL element having a long element life can be produced by forming a cathode without exposing the organic light-emitting layer or the like to the air.

Then, layer formation may be performed in an inert gas atmosphere or in a vacuum atmosphere until the second electrode is formed while holding, in an inert gas atmosphere or vacuum atmosphere, the surrounding of layers to be formed including the layer located on the light-emitting layer.

The organic EL element is not limited to the element constitution of this embodiment illustrated in FIG. 1 and may have various element constitutions. Hereinafter, the element constitution of an organic EL element to which the present invention can be applied and each constituent element are described in more detail.

As described above, functional layers may be provided between an organic light-emitting layer and an anode and between an organic light-emitting layer and a cathode according to need. A functional layer means a layer that does not participate directly in light emission and has a function to improve element characteristics, such as injection and transportation of charges. For example, a hole injection layer, a hole transporting layer, a hole blocking layer, an electron injection layer, an electron transporting layer, an electron blocking layer correspond to the functional layer.

Examples of the layer to be provided between the cathode and the light-emitting layer include an electron injection layer, an electron transporting layer, a hole blocking layer and the like. When two functional layers are provided between the cathode and the light-emitting layer, the layer that is in contact with the cathode is referred to as an electron injection layer and the layer excluding this electron injection layer may be referred to as an electron transporting layer. The electron injection layer is a layer that has a function to improve electron injection efficiency from a cathode. The electron transporting layer is a layer that has a function to improve electron injection from a cathode, an electron injection layer, or an electron transporting layer that is closer to the cathode. The hole blocking layer is a layer that has a function to block the transportation of holes. When the electron injection layer and/or the electron transporting layer has a function to block the transportation of holes, these layers may also serve as a hole blocking layer.

It can be confirmed that a hole blocking layer has a function to block the transportation of holes by, for example, producing an element that allows only a hole current to pass. For example, it can be confirmed that a hole blocking layer exhibits a function to block the transportation of holes by producing an element that has no hole blocking layer and allows only a hole current to flow and an element of a constitution in which a hole blocking layer has been inserted in the foregoing element, and detecting decrease in the current value of the element having the hole blocking layer.

Examples of the layer to be provided between the anode and the light-emitting layer include a hole injection layer, a hole transporting layer, and an electron blocking layer. When two functional layers are provided between the anode and the light-emitting layer, the layer that is in contact with the anode may be referred to as a hole injection layer and the layer excluding this hole injection layer may be referred to as a hole transporting layer.

The hole injection layer is a layer that has a function to improve hole injection efficiency from an anode. The hole transporting layer is a layer that has a function to improve hole injection from an anode, a hole injection layer, or a hole transporting layer that is closer to the anode. The electron blocking layer is a layer that has a function to block the transportation of electrons. When the hole injection layer and/or the hole transporting layer has a function to block the transportation of electrons, these layers may also serve as an electron blocking layer.

It can be confirmed that an electron blocking layer has a function to block the transportation of electrons by, for example, producing an element that allows only an electron current to pass. For example, it can be confirmed that an electron blocking layer exhibits a function to block the transportation of electrons by producing an element that has no electron blocking layer and allows only an electron current to flow and an element of a constitution in which an electron blocking layer has been inserted in the foregoing element, and detecting decrease in the current value of the element having the electron blocking layer.

Examples of the element constitution that the organic EL element can have are provided below:
a) anode/light-emitting layer/cathode
b) anode/hole injection layer/light-emitting layer/cathode
c) anode/hole injection layer/light-emitting layer/electron injection layer/cathode
d) anode/hole injection layer/light-emitting layer/electron transporting layer/cathode
e) anode/hole injection layer/light-emitting layer/electron transporting layer/electron injection layer/cathode
f) anode/hole transporting layer/light-emitting layer/cathode
g) anode/hole transporting layer/light-emitting layer/electron injection layer/cathode
h) anode/hole transporting layer/light-emitting layer/electron transporting layer/cathode
i) anode/hole transporting layer/light-emitting layer/electron transporting layer/electron injection layer/cathode
j) anode/hole injection layer/hole transporting layer/light-emitting layer/cathode
k) anode/hole injection layer/hole transporting layer/light-emitting layer/electron injection layer/cathode
l) anode/hole injection layer/hole transporting layer/light-emitting layer/electron transporting layer/cathode
m) anode/hole injection layer/hole transporting layer/light-emitting layer/electron transporting layer/electron injection layer/cathode
n) anode/light-emitting layer/electron injection layer/cathode
o) anode/light-emitting layer/electron transporting layer/cathode
p) anode/light-emitting layer/electron transporting layer/electron injection layer/cathode
(here, the sign "I" means that the layers sandwiching the sign "I" are laminated next to each other, and this is applied hereinafter.)

The organic EL element may have two or more light-emitting layers. When all layers sandwiched by the anode and the cathode (in the case of only one layer, this layer) are collectively represented by "repeating unit A" in the respective constitutions given in a) through p), an organic EL element having two light-emitting layers may be of the element constitution given in the following q):
q) anode/(repeating unit A)/charge generating layer/(repeating unit A)/cathode.

If "(repeating unit A)/charge generating layer" is represented by "repeating unit B", an organic EL element having three or more light-emitting layers may specifically be of the element constitution represented in the following r):
r) anode/(repeating unit B)x/(repeating unit A)/cathode.

Here, the sign "x" represents an integer of 2 or more, and the sign "(repeating unit B) x" represents a constitution in which (repeating unit B) has been laminated in "x" layers. The charge generating layer is a layer in which a hole and an electron are generated by applying an electric field. Examples of the charge generating layer include thin films made of vanadium oxide, indium tin oxide (abbreviated as ITO), molybdenum oxide, and the like.

In order to take out light generated inside the organic EL element of this embodiment, all layers of the element which are disposed on the side, with respect to the light-emitting layer, where light is to be taken out are configured to be transparent. As to the degree of transparency, the visible light transmittance between the outermost surface of the organic EL element on the side where light is to be taken out and the light-emitting layer is preferably 40% or more. In the case of an organic EL element with which emission of light in the ultraviolet region or the infrared region is required, an element that exhibits a light transmittance in this region of 40% or more is preferred.

The organic EL element of this embodiment may further be provided with an insulating layer having a thickness of 2 nm or less next to an electrode in order to improve the adhesiveness to the electrode or improve the charge injection property from the electrode. For the purpose of improving the adhesiveness or preventing mixing at an interface, it is permissible to insert a thin buffer layer between the aforementioned layers.

The order of the layers to be laminated, the number of the layers, and the thickness of each layer can be determined appropriately by taking into account the light emission efficiency and the element life.

Next, the material and formation method of each of the layers constituting an organic EL element are described more concretely.

<Substrate>

A substrate that does not change during the step of producing an organic EL element is suitably used, and for example, glass, plastics, macromolecular films, silicon substrates, and their laminates are used. As the substrate, commercially available products can be used. A substrate can also be produced by a known method. A substrate that exhibits translucency is used in so-called a bottom emission type organic EL element in which light is taken out from its substrate, whereas in a top emission type organic EL element, the substrate may be either transparent or opaque.

<Anode>

Regarding an anode, in the case of an organic EL element having such a constitution that light is taken out from a light-emitting layer through an anode, a transparent electrode that exhibits light permeability is used. Thin films of metal oxides, metal sulfides, metals, and the like that are high in electrical conductivity can be used as such an electrode, and materials that are high in light transmittance are suitably used. Specifically, films composed of indium oxide, zinc oxide, tin oxide, ITO, indium zinc oxide (abbreviated as IZO), gold, platinum, silver, copper, and the like are used, and among these, a thin film composed of ITO, IZO, or tin oxide is suitably used. Examples of a method for producing the anode include a vacuum deposition method, a sputtering method, an ion plating method, and a plating method. Moreover, an organic transparent conductive film of polyaniline or its derivatives, polythiophene or its derivatives, or the like may also be used as the anode.

For the anode, a material that reflects light may also be used, and metals, metal oxides, and metal sulfides that have a work function of 3.0 eV or more are preferred as the material.

The thickness of the anode can be determined appropriately by taking into account the light permeability and the electrical conductivity, and it is, for example, 10 nm to 10 µm, preferably 20 nm to 1 µm, and more preferably 50 nm to 500 nm.

<Hole Injection Layer>

Examples of the hole injection material constituting the hole injection layer include oxides, such as vanadium oxide, molybdenum oxide, ruthenium oxide, and aluminum oxide, phenylamine-based, starburst-type amine-based, phthalocyanine-based, amorphous carbon, polyaniline, and polythiophene derivatives.

Examples of a method for the film formation of the hole injection layer include film formation from a solution which contains a hole injection material, and from the viewpoint of prolongation of life, it is preferred to form a film in an atmosphere that is the same as that where the above-described organic light-emitting layer is formed. The solvent to be used for the film formation from a solution is not particularly restricted as long as it is a solvent that dissolves the hole injection material, and examples thereof include chlorine-based solvents, such as chloroform, methylene chloride, and dichloroethane, ether-based solvents, such as tetrahydrofuran, aromatic hydrocarbon-based solvents, such as toluene and xylene, ketone-based solvents, such as acetone and methyl ethyl ketone, ester-based solvents, such as ethyl acetate, butyl acetate, and ethyl cellosolve acetate, alcohol-based solvents, such as isopropyl alcohol, and water, and mixtures thereof may also be used.

Examples of the method of the film formation from a solution include application methods, such as a spin coating method, a casting method, a nozzle coating method, a microgravure coating method, a gravure coating method, a bar coating method, a roll coating method, a wire bar coating method, a dip coating method, a spray coating method, a screen printing method, a flexographic printing method, an offset printing method, and an ink jet printing method.

As to the thickness of the hole injection layer, its optimal value varies depending on the material to be used and the thickness is determined appropriately so that a driving voltage and light-emitting efficiency may become moderate values and such a thickness that no pinhole is formed is required. If the thickness is excessively large, the driving voltage of an element becomes high and thus, it is not preferable. Therefore, the thickness of the hole injection layer is, for example, 1 nm to 1 µm, preferably 2 nm to 500 nm, and more preferably 5 nm to 200 nm.

<Hole Transporting Layer>

The material constituting the hole transporting layer (the hole transporting material) preferably contains a macromolecular compound because it is good in solubility in a solvent and it is easy to form the hole transporting layer by an application method.

Examples of the hole transporting material constituting the hole transporting layer include polyvinylcarbazole or its derivatives, polysilane or its derivatives, polysiloxane derivatives having an aromatic amine in their side chain or main chain, pyrazoline derivatives, arylamine derivatives, stilbene derivatives, triphenyldiamine derivatives, polyaniline or its derivatives, polythiophene or its derivatives, polyarylamine or its derivatives, polypyrrole or its derivatives, poly(p-phenylenevinylene) or its derivatives, or poly(2,5-thienylenevinylene) or its derivatives.

Among these, macromolecular hole transporting materials, such as polyvinylcarbazole or its derivatives, polysilane or its derivatives, polysiloxane derivatives having an aromatic amine compound group in their side chain or main chain, polyaniline or its derivatives, polythiophene or its derivatives, polyarylamine or its derivatives, poly(p-phenylenevinylene) or its derivatives, or poly(2,5-thienylenevinylene) or its derivatives, are preferred as the hole transporting material and polyvinylcarbazole or its derivatives, polysilane or its derivatives, and polysiloxane derivatives having an aromatic amine in their side chain or main chain are more preferred. In the case of a low-molecular hole transporting material, it is preferably used by dispersing the material in a macromolecular binder.

Examples of a method for the film formation of the hole transporting layer include, but are not particularly restricted to, film formation from a mixed liquid containing a macromolecular binder and a hole transporting material in the case of a low-molecular hole transporting material and include film formation from a solution containing a hole transporting material in the case of a macromolecular hole transporting material.

The solvent to be used for the film formation from a solution is not particularly restricted as long as it is a solvent that dissolves the hole transporting material, and examples thereof include chlorine-based solvents, such as chloroform, methylene chloride, and dichloroethane, ether-based solvents, such as tetrahydrofuran, aromatic hydrocarbon-based solvents, such as toluene and xylene, ketone-based solvents, such as acetone and methyl ethyl ketone, ester-based solvents, such as ethyl acetate, butyl acetate, and ethyl cellosolve acetate, and mixtures thereof may also be used.

Examples of the method of film formation from a solution include applying methods that are the same as those for the above-described method for the film formation of the hole injection layer, and from the viewpoint of prolongation of life, it is preferred to form a film in an atmosphere that is the same as that where the above-described organic light-emitting layer is formed.

As the macromolecular binder to be mixed, binders that do not inhibit charge transport excessively are preferred, and binders that exhibit weak absorption to visible light are preferably used, and examples thereof include polycarbonate, polyacrylate, polymethyl acrylate, polymethyl methacrylate, polystyrene, polyvinyl chloride, and polysiloxane.

As to the thickness of the hole transporting layer, its optimal value varies depending on the material to be used and the thickness is determined appropriately so that a driving voltage and light emission efficiency may become moderate values and such a thickness that no pinhole is formed is required. If the thickness is excessively large, the driving voltage of an element becomes high and thus, it is not preferable. Therefore, the thickness of the hole transporting layer is, for example, 1 nm to 1 µm, preferably 2 nm to 500 nm, and more preferably 5 nm to 200 nm.

<Light-Emitting Layer>

The light-emitting layer is usually formed mainly of an organic substance that emits fluorescence and/or phosphorescence, or the organic substance and a dopant that assists the organic substance. The dopant is added, for example, for improving the light emission efficiency or changing the light emission wavelength. The organic substance may be either a low-molecular compound or a macromolecular compound, and the light-emitting layer preferably contains a macromolecular compound having a polystyrene-equivalent number average molecular weight of from $10^3$ to $10^8$. Examples of the light-emitting material constituting the light-emitting layer include the following dye-based materials, metal complex-based materials, macromolecule-based materials, and dopant materials.

The material forming the light-emitting layer (light-emitting material) preferably contains a macromolecular compound because it is good in solubility in a solvent and it is easy to form the light-emitting layer by an applying method.

(Dye-Based Material)

Examples of the dye-based material include cyclopendamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, trifumanylamine derivatives, oxadiazole dimmers, pyrazoline dimmers, quinacridone derivatives, and coumarin derivatives.

(Metal Complex-Based Material)

Examples of the metal complex-based material include metal complexes having Al, Zn, Be or the like or rare earth metals, such as Tb, Eu, and Dy, as a central metal and an oxadiazole structure, a thiadiazole structure, a pheylpyridine structure, a pheylbenzoimidazole structure, a quinoline structure, or the like as a ligand, and examples thereof include metal complexes having light emission from a triplet excited state, such as iridium complexes and platinum complexes, alumiquinolinol complexes, benzoquinolinol beryllium complexes, benzooxazolyl zinc complexes, benzothiazole zinc complexes, azomethyl zinc complexes, porphyrin zinc complexes, and europium complexes.

(Macromolecule-Based Material)

Examples of the macromolecule-based material include polyparaphenylene vinylene derivatives, polythiophene derivatives, polyparaphenylene derivatives, polysilane derivatives, polyacetylene derivatives, polyfluorene derivatives, polyvinylcarbazole derivatives, and products produced by polymerizing the above-mentioned dye-based materials or metal complex-based light-emitting materials.

Among the above-mentioned light-emitting materials, examples of a material that emits blue light include distyrylarylene derivatives, oxadiazole derivatives, and their polymers, polyvinylcarbazole derivatives, polyparaphenylene derivatives, and polyfluorene derivatives. Especially, polyvinylcarbazole derivatives, polyparaphenylene derivatives, and polyfluorene derivatives, which are macromolecular materials, are preferred.

Examples of a material that emits green light include quinacridone derivatives, coumarin derivatives, and their polymers, polyparaphenylene vinylene derivatives, and polyfluorene derivatives. Especially, polyparaphenylene vinylene derivatives and polyfluorene derivatives, which are macromolecular materials, are preferred.

Examples of a material that emits red light include coumarin derivatives, thiophene ring compounds, and their polymers, polyparaphenylene vinylene derivatives, polythiophene derivatives, and polyfluorene derivatives. Especially, polyparaphenylene vinylene derivatives, polythiophene derivatives, and polyfluorene derivatives, which are macromolecular materials, are preferred.

(Dopant Material)

Examples of the dopant material include perylene derivatives, coumarin derivatives, rubrene derivatives, quinacridone derivatives, squarium derivatives, porphyrin derivatives, styryl-based dyes, tetracene derivatives, pyrazolone derivatives, decacyclene, and phenoxazone. The thickness of such a light-emitting layer is usually about 2 nm to 200 nm.

As to a method for the film formation of the light-emitting layer, the layer is formed by film formation from a solution containing a light-emitting material as described above. Examples of the solvent to be used for the film formation from a solvent include solvents that are the same as those to be used for the film formation of the hole transporting layer from a solution as described above.

Examples of a method for applying the solution containing an light-emitting material include coating methods, such as a spin coating method, a casting method, a microgravure coating method, a gravure coating method, a bar coating method, a roll coating method, a wire bar coating method, a dip coating method, a slit coating method, a capillary coating method, a spray coating method, and a nozzle coating method, and printing methods, such as a gravure printing method, a screen printing method, a flexographic printing method, an offset printing method, a reverse printing method, and an ink jet printing method. Because it is easy to perform pattern formation or multicolor application, printing methods, such as a gravure printing method, a screen printing method, a flexographic printing method, an offset printing method, a reverse printing method, and an ink jet printing method are preferred.

<Electron Transporting Layer>

Known materials can be used as the electron transporting material constituting the electron transporting layer, and examples thereof include oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, or 8-hydroxyquinoline or metal complexes of its derivatives, polyquinoline or its derivatives, polyquinoxaline or its derivatives, and polyfluorene or its derivatives.

Among these, as the electron transporting material, oxadiazole derivatives, benzoquinone or its derivatives, anthraquinone or its derivatives, or 8-hydroxyquinoline or metal complexes of its derivatives, polyquinoline or its derivatives, polyquinoxaline or its derivatives, and polyfluorene or its derivatives are preferred, and 2-(4-biphenylyl)-5-(4-tert-butylphenyl)-1,3,4-oxadiazole, benzoquinone, anthraquinone, tris(8-quinolinol)aluminum, and polyquinoline are more preferred.

Examples of a method for the formation of the electron transporting layer include, but are not particularly restricted to, a vacuum vapor deposition method from a powder or film formation from a solution or a molten state in the case of a low-molecular electron transporting material, and include film formation from a solution or a molten state in the case of a macromolecular electron transporting material. When a film is formed from a solution or a molten state, a macromolecular binder may be used together. Examples of the method for the formation of the electron transporting layer from a solution include film formation methods that are the same as those for the film formation of the hole transporting layer from a solution as described above, and it is preferred to form a film in an atmosphere that is the same as that where the aforementioned organic light-emitting layer is formed.

As to the thickness of the electron transporting layer, its optimal value varies depending on the material to be used and the thickness is determined appropriately so that a driving voltage and light emission efficiency may become moderate values and such a thickness that no pinhole is formed is required. If the thickness is excessively large, the driving voltage of an element becomes high and thus, it is not preferable. Therefore, the thickness of the electron transporting layer is, for example, 1 nm to 1 μm, preferably 2 nm to 500 nm, and more preferably 5 nm to 200 nm.

<Electron Injection Layer>

An optimal material is selected appropriately as the material constituting the electron injection layer according to the kind of the light-emitting layer, and examples thereof include alkali metals, alkaline earth metals, alloys containing one or more of alkali metals and alkaline earth metals, and oxides, halides, and carbonates of the alkali metals or the alkaline earth metals, or mixtures of these substances. Examples of the alkali metals and the oxides, halides, and carbonates of the alkali metals include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metals and the oxides, halides, and carbonates of the alkaline earth metals include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be composed of a layered body in which two or more layers are laminated and examples thereof include LiF/Ca. The electron injection layer is formed by a vacuum deposition method, a sputtering method, a printing method, or the like.

The thickness of the electron injection layer is preferably about 1 nm to about 1 μm.

<Cathode>

The material of the cathode is preferably a material that has a small work function, easily injects electrons into a light-emitting layer, and has high electrical conductivity. For such an organic EL element in which light is taken out from the anode side, the material of the cathode is preferably a material that is high in visible light reflectance in order to reflect the light from the light-emitting layer on the cathode toward the anode side. For the cathode, there can be used, for example, alkali metals, alkaline earth metals, transition metals, and metals of Group 13 of the periodic table. As the material of the cathode, there are used metals, such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys of two or more of the foregoing metals, alloys of one or more of the foregoing metals and one or more selected from among gold, silver, platinum, copper, manganese, titanium, cobalt, nickel, tungsten, and tin, or graphite or graphite intercalation compounds, and the like. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. Transparent conductive electrodes composed of conductive metal oxides, conductive organic substances, and the like can be used as a cathode. Specifically, examples of the conductive metal oxides include indium oxide, zinc oxide, tin oxide, ITO, and IZO, and examples of the conductive organic substances include polyaniline or its derivatives, and polythiophene or its derivatives. The cathode may be composed of a layered article in which two or more layers are laminated. Moreover, an electron injection layer may also be used as a cathode.

The thickness of the cathode is determined appropriately by taking into account the electrical conductivity and the durability, and it is, for example, 10 nm to 10 μm, preferably 20 nm to 1 μm, and more preferably 50 nm to 500 nm.

Examples of a method for producing the cathode include a vacuum deposition method, a sputtering method, and a laminating method by which a metal thin film is bonded by thermocompression.

<Insulating Layer>

Examples of the material of the insulating layer include metal fluorides, metal oxides, and organic insulating materials. Examples of an organic EL element in which an insulating layer having a thickness of 2 nm or less has been provided include one in which an insulating layer having a thickness of 2 nm or less has been provided next to a cathode, and one in which an insulating layer having a thickness of 2 nm or less has been provided next to an anode.

Although the description has been made with a configuration in which the first electrode is an anode and the second electrode is a cathode in the above embodiment, another embodiment may be an organic EL element having a constitution in which the first electrode is a cathode and the second electrode is an anode. The second electrode (anode) is formed later than the first electrode (cathode). Therefore, in the case of providing an organic EL element on a substrate, for example, in the case of the layer constitution of the above-described a) to r), each layer is formed on the substrate one after another from the cathode side. Even in organic EL elements having such a constitution, it is possible to realize an organic EL element having a long element life by using an atmosphere containing an inert gas or a vacuum atmosphere as an atmosphere to be used after an applied film for an organic light-emitting layer is calcined to form the organic light-emitting layer and until the second electrode (anode) is formed.

By mounting the organic EL element described above, it is possible to realize a planar light source to be used as a light source of a curved or flat light device, such as a scanner, and a display device. Since the production of an organic EL element by the production method of the present invention as described above can realize an organic EL element, a lighting device, a planar light source, and a display device with good life characteristics can be realized.

Examples of a display device comprising an organic EL element include active matrix display devices, passive matrix display devices, segment display devices, dot matrix display devices, and liquid crystal display devices. Organic EL elements are used as light emitting elements constituting individual pixels in active matrix display devices and passive matrix display devices, as light emitting elements constituting individual segments in segment display devices, and as backlight in dot matrix display devices and liquid crystal display devices.

EXAMPLES

The present invention will be described in more detail hereinbelow with reference to examples, but the invention is not limited to the examples.

Example 1

An organic EL element of the following constitution was produced.

"Glass substrate/ITO (150 nm)/Baytron P (65 nm)/
macromolecular compound 1 (20 nm)/macromolecular compound 2 (65 nm)/Ba (5 nm)/Al (80 nm)"

A 65 nm-thick applied film was formed first by applying a suspension of poly(3,4)ethylene dioxythiophene/polystyrene sulfonic acid (manufactured by Starck Ltd; Baytron P) by a spin coating method to a glass substrate on which a 150 nm-thick ITO film (anode) had been formed by a sputtering method, and further a hole injection layer was obtained by drying the applied film on a hot plate at 200° C. for 10 minutes. The formation of the hole injection layer was performed in the areal atmosphere.

Next, xylene solution 1 was prepared by dissolving macromolecular compound 1 in xylene. The concentration of macromolecular compound 1 in this xylene solution 1 was adjusted to 0.8% by weight. Next, xylene solution 1 was applied to a substrate by a spin coating method in the areal atmosphere, so that a 20 nm-thick applied film for a hole transporting layer was formed, and moreover, the applied film was calcined by holding the film at 180° C. for 60 minutes in a nitrogen atmosphere of which oxygen concentration and moisture concentration were each controlled to 10 ppm or less in volume ratio, so that a hole transporting layer was obtained. The pressure of the atmosphere in the step of forming the hole transporting layer was made to be the atmospheric pressure.

Next, xylene solution 2 was prepared by dissolving macromolecular compound 2 in xylene. The concentration of macromolecular compound 2 in this xylene solution 2 was adjusted to 1.3% by weight. Xylene solution 2 was applied to a substrate by a spin coating method in the areal atmosphere, so that a 65 nm-thick applied film for a light-emitting layer was formed. Moreover, the applied film was calcined by holding the film at 130° C. for 60 minutes in vacuum of $5.0 \times 10^{-4}$ Pa or less, so that a light-emitting layer was obtained.

Next, it was left for 10 minutes in a nitrogen atmosphere. Subsequently, the pressure was reduced to $1.0 \times 10^{-4}$ Pa or less, and then about 5 nm of barium and about 80 nm of aluminum were vapor-deposited as a cathode in this vacuum atmosphere. After the vapor deposition, sealing was done by using a glass substrate, so that an organic EL element was produced.

When the produced organic EL element was driven at a constant current at an initial luminance of 8,000 cd/m$^2$, the time taken until the luminance became 50% of the initial luminance (i.e., the life) was 90 hours.

Comparative Example 1

In Comparative Example 1, an organic EL element was formed in the same manner as in Example 1 except for differentiating the atmosphere of a substrate after a light-emitting layer was formed and until a cathode was vapor-deposited from that in Example 1. Specifically, an applied film was calcined to yield a light-emitting layer, then it was left for 10 minutes in a nitrogen atmosphere, and then a cathode was formed in a vacuum atmosphere in Example 1, whereas in Comparative Example 1, an applied film was calcined to yield a light-emitting layer, then a substrate with the light-emitting layer was exposed to the areal atmosphere for 10 minutes, and then a cathode was formed in a vacuum atmosphere.

When the produced organic EL element was driven at a constant current at an initial luminance of 8,000 cd/m$^2$, the time taken until the luminance became 50% of the initial luminance (i.e., the life) was 59 hours.

Example 2

An organic EL element of the following constitution was produced.

"Glass substrate/ITO (150 nm)/Baytron P (65 nm)/ macromolecular compound 1 (20 nm)/macromolecular compound 2 (65 nm)/Ba (5 nm)/Al (80 nm)"

A 65 nm-thick applied film was formed first by applying a suspension of poly(3,4)ethylene dioxythiophene/polystyrene sulfonic acid (manufactured by Starck Ltd; Baytron P) by a spin coating method to a glass substrate on which a 150 nm-thick ITO film (anode) had been formed by a sputtering method, and further a hole injection layer was obtained by drying the applied film on a hot plate at 200° C. for 10 minutes. The formation of the hole injection layer was performed in the areal atmosphere.

Next, xylene solution 1 was prepared in the same manner as in Example 1. Xylene solution 1 was applied to a substrate by a spin coating method in a nitrogen atmosphere of which oxygen concentration and moisture concentration were each controlled to 10 ppm or less in volume ratio, so that a 20 nm-thick applied film for a hole transporting layer was formed.

Moreover, the applied film was calcined by holding the film at 180° C. for 60 minutes in the nitrogen atmosphere of which oxygen concentration and moisture concentration were each controlled to 10 ppm or less in volume ratio, so that a hole transporting layer was obtained. The pressure of the atmosphere in the step of forming the hole transporting layer was made to be the atmospheric pressure.

Next, xylene solution 2 was prepared in the same manner as in Example 1. After the hole transporting layer was obtained, xylene solution 2 was applied to a substrate by a spin coating method in a nitrogen atmosphere of which oxygen concentration and moisture concentration were each controlled to 10 ppm or less in volume ratio without exposing the layer to the areal atmosphere, so that a 65 nm-thick applied film for a light-emitting layer was formed. Moreover, the applied film was calcined by holding the film at 130° C. for 60 minutes in vacuum of $5.0 \times 10^{-4}$ Pa or less, so that a light-emitting layer was obtained.

Next, the substrate with the light-emitting layer was left for 10 minutes in a nitrogen atmosphere and the pressure was reduced to $1.0 \times 10^{-4}$ Pa or less, and then about 5 nm of barium and subsequently about 80 nm of aluminum were vapor-deposited as a cathode. After the vapor deposition, sealing was done by using a glass substrate, so that an organic electroluminescent element was produced.

When the produced organic EL element was driven at a constant current at an initial luminance of 8,000 cd/m$^2$, the time taken until the luminance became 50% of the initial luminance (i.e., the life) was 130 hours.

Comparative Example 2

In Comparative Example 2, an organic EL element was formed in the same manner as in Example 2 except for differentiating the atmosphere of a substrate after a light-emitting layer was formed and until a cathode was vapor-deposited from that in Example 2. Specifically, an applied film was calcined to yield a light-emitting layer, then it was left for 10 minutes in a nitrogen atmosphere, and then a cathode was formed in a vacuum atmosphere in Example 2, whereas in Comparative Example 2, an applied film was calcined to yield a light-emitting layer, then a substrate with the light-emitting layer was exposed to the areal atmosphere for 10 minutes, and then a cathode was formed.

When the produced organic EL element was driven at a constant current at an initial luminance of 8,000 cd/m$^2$, the time taken until the luminance became 50% of the initial luminance (i.e., the life) was 100 hours.

Example 3

An organic EL element of the following constitution was produced. In Example 3, unlike Examples 1 and 2, the calcination of a light-emitting layer was performed not in a vacuum atmosphere but in a nitrogen atmosphere.

"Glass substrate/ITO (150 nm)/Baytron P (65 nm)/ macromolecular compound 1 (20 nm)/macromolecular compound 2 (65 nm)/Ba (5 nm)/Al (80 nm)"

A 65 nm-thick applied film was formed first by applying a suspension of poly(3,4)ethylene dioxythiophene/polystyrene sulfonic acid (manufactured by Starck Ltd; Baytron P) by a spin coating method to a glass substrate on which a 150 nm-thick ITO film (anode) had been formed by a sputtering method, and further a hole injection layer was obtained by drying the applied film on a hot plate at 200° C. for 10 minutes. The formation of the hole injection layer was performed in the areal atmosphere.

Next, xylene solution 1 was prepared in the same manner as in Example 1. Xylene solution 1 was applied to a substrate by a spin coating method in the areal atmosphere, so that a 20 nm-thick applied film for a hole transporting layer was formed. Subsequently, the applied film was calcined by holding the film at 180° C. for 60 minutes in a nitrogen atmosphere of which oxygen concentration and moisture concentration were each controlled to 10 ppm or less in volume ratio, so that a hole transporting layer was obtained.

Next, xylene solution 2 was prepared in the same manner as in Example 1. Xylene solution 2 was applied to a substrate by a spin coating method in the areal atmosphere, so that a 65 nm-thick applied film for a light-emitting layer was formed. Moreover, the applied film was calcined by holding the film at 130° C. for 10 minutes in the nitrogen atmosphere of which oxygen concentration and moisture concentration were each controlled to 10 ppm or less in volume ratio, so that a light-emitting layer was obtained. The pressure of the atmosphere in the step of forming the hole transporting layer and the light-emitting layer was made to be the atmospheric pressure.

After the applied film was calcined, the pressure was reduced to $1.0 \times 10^{-4}$ Pa or less without exposing to the areal atmosphere, and then about 5 nm of barium and subsequently about 80 nm of aluminum were vapor-deposited as a cathode. After the vapor deposition, sealing was done by using a glass substrate, so that an organic electroluminescent element was produced.

When the produced organic EL element was driven at a constant current at an initial luminance of 8,000 cd/m$^2$, the time taken until the luminance became 50% of the initial luminance (i.e., the life) was 60 hours.

Example 4

An organic EL element of the following constitution was produced. In Example 4, unlike Examples 1 and 2, the calcination of a light-emitting layer was performed not in a vacuum atmosphere but in a nitrogen atmosphere.

"Glass substrate/ITO (150 nm)/Baytron P (65 nm)/ macromolecular compound 1 (20 nm)/macromolecular compound 2 (65 nm)/Ba (5 nm)/Al (80 nm)"

A 65 nm-thick applied film was formed first by applying a suspension of poly(3,4)ethylene dioxythiophene/polystyrene sulfonic acid (manufactured by Starck Ltd; Baytron P) by a spin coating method to a glass substrate on which a 150 nm-thick ITO film (anode) had been formed by a sputtering method, and further a hole injection layer was obtained by drying the applied film on a hot plate at 200° C. for 10 minutes. The formation of the hole injection layer was performed in the areal atmosphere.

Next, xylene solution 1 was prepared in the same manner as in Example 1. Xylene solution 1 was applied to a substrate by a spin coating method in a nitrogen atmosphere of which oxygen concentration and moisture concentration were each controlled to 10 ppm or less in volume ratio, so that a 20 nm-thick applied film for a hole transporting layer was formed.

Moreover, the applied film was calcined by holding the film at 180° C. for 60 minutes in the nitrogen atmosphere of which oxygen concentration and moisture concentration were each controlled to 10 ppm or less in volume ratio, so that a hole transporting layer was obtained. The pressure of the atmosphere in the step of forming the hole transporting layer was made to be the atmospheric pressure.

Next, xylene solution 2 was prepared in the same manner as in Example 1. Xylene solution 2 was applied to a substrate by a spin coating method in the nitrogen atmosphere of which oxygen concentration and moisture concentration were each controlled to 10 ppm or less in volume ratio, so that a 65 nm-thick applied film for a light-emitting layer was formed. Moreover, the applied film was calcined by heating the film at 130° C. for 10 minutes in the nitrogen atmosphere of which oxygen concentration and moisture concentration were each controlled to 10 ppm or less in volume ratio, so that a light-emitting layer was obtained.

After the applied film was calcined, the pressure was reduced to $1.0 \times 10^{-4}$ Pa or less without exposing to the areal atmosphere, and then about 5 nm of barium and subsequently about 80 nm of aluminum were vapor-deposited as a cathode. After the vapor deposition, sealing was done by using a glass substrate, so that an organic electroluminescent element was produced.

When the produced organic EL element was driven at a constant current at an initial luminance of 8,000 cd/m$^2$, the time taken until the luminance became 50% of the initial luminance (i.e., the life) was 100 hours.

Based on the above results, it was confirmed that an element life is improved by holding in a vacuum of 10 Pa or less to form a light-emitting layer and then forming a cathode while holding a vacuum atmosphere or an inert gas atmosphere without exposing the substrate with the light-emitting layer to the areal atmosphere.

Even if organic EL elements are produced in the same manners as in Examples 1 and 2 using, for example, macromolecular compound 3 described below instead of macromolecular compound 1 described above and using Lumation BP361 (manufactured by Sumation Ltd) instead of macromolecular compound 2, organic EL elements each having long element life likely to the organic EL elements of Examples 1 and 2 can be realized.

(Macromolecular Compound 3)

Macromolecular compound 3 comprising two repeating units represented by the following structural formulas was synthesized as follows.

[Chemical Formula 1]

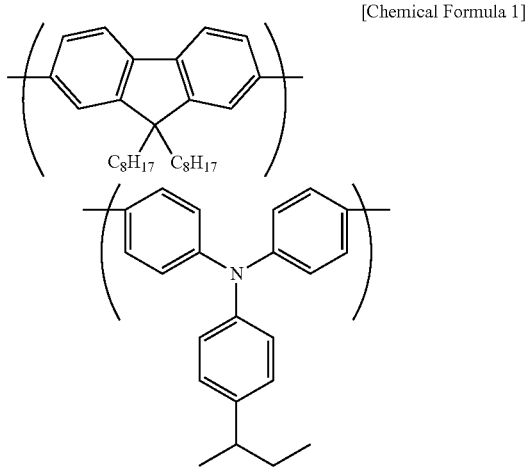

In an inert atmosphere, 2,7-bis(1,3,2-dioxaborolan-2-yl)-9,9-dioctylfluorene (5.20 g), bis(4-bromophenyl)-(4-secondarybutylphenyl)-amine (0.14 g), palladium acetate (2.2 mg), tri(2-methylphenyl)phosphine (15.1 mg), Aliquat336 (0.91 g, manufactured by Aldrich), and toluene (70 ml) were mixed and heated to 105° C. A 2M aqueous Na2CO3 solution (19 ml) was added dropwise to this reaction solution, followed by refluxing for 4 hours. After the reaction, phenylboric acid (121 mg) was added, followed by refluxing for additional 3 hours. Subsequently, an aqueous sodium diethyldithiacarbamate solution was added, followed by stirring at 80° C. for 4 hours. After cooling, the resultant was washed with water (60 ml) three times, a 3% aqueous acetic acid solution (60 ml) three times, and water (60 ml) three times, and was purified by being made to pass through an alumina column and a silica gel column. The resulting toluene solution was added dropwise to methanol (3 L), followed by stirring for 3 hours, and then the resulting solid was collected by filtration and dried. The yield of macromolecular compound 3 obtained was 5.25 g.

Macromolecular compound 3 had a polystyrene-equivalent number average molecular weight of $1.2 \times 10^5$ and a polystyrene-equivalent weight average molecular weight of $2.6 \times 10^4$.

BRIEF DESCRIPTIONS OF THE DRAWING

FIG. 1 A sectional view schematically showing the structure of an organic EL element that is one embodiment of the present invention.

DESCRIPTION OF REFERENCE NUMERALS

1 . . . Organic EL element,
2 . . . Substrate,
3 . . . Anode,
4 . . . Hole injection layer,
5 . . . Hole transporting layer,
6 . . . Organic light-emitting layer,
7 . . . Cathode.

The invention claimed is:

1. A method for producing an organic electroluminescent element comprising a first electrode that is formed first, a second electrode that is formed later, and a light-emitting layer that is formed between the first electrode and the second electrode, the method comprising the steps of:

applying a solution containing a light-emitting organic material to a surface of a layer located below in an air atmosphere, using atmospheric air, to form an applied film;
calcining the applied film in a vacuum atmosphere to form a light-emitting layer;
holding the surrounding of the formed light-emitting layer in a vacuum atmosphere; and
forming a layer located on the light-emitting layer in a vacuum atmosphere.

2. The method according to claim 1, further comprising the step of forming a layer in an inert gas atmosphere or in a vacuum atmosphere after the layer located on the light-emitting layer is formed until the second electrode is formed, while the surrounding of the layers to be formed including a layer located on the light-emitting layer being held in an inert gas atmosphere or in a vacuum atmosphere.

3. The method according to claim 1, wherein the layer located on the light-emitting layer is the second electrode.

4. The method according to claim 1, wherein the light-emitting organic material comprises a light-emitting macromolecular compound.

5. The method according to claim 4, wherein the light-emitting macromolecular compound is at least one kind selected from the group consisting of polyparaphenylene vinylene derivatives, polythiophene derivatives, polyparaphenylene derivatives, polysilane derivatives, polyacetylene derivatives, polyfluorene derivatives, and polyvinylcarbazole derivatives.

6. The method according to claim 4, wherein the light-emitting macromolecular compound is at least one kind selected from the group consisting of polyvinylcarbazole derivatives, polyparaphenylene derivatives and polyfluorene derivatives as materials that emit blue light; polyparaphenylene vinylene derivatives and polyfluorene derivatives as materials that emit green light; polyparaphenylene vinylene derivatives, polythiophene derivatives and polyfluorene derivatives as materials that emit red light.

7. The method according to claim 1, further comprising, before the step of applying a solution containing a light-emitting organic material to form an applied film, as a method of forming a layer located below the light-emitting layer, the steps of:

applying a solution containing a functional organic material to a surface of a layer located below to form an applied film; and
calcining the applied film in an inert gas atmosphere or in a vacuum atmosphere to form a functional layer.

8. The method according to claim 7, further comprising the step of holding the surrounding of the formed functional layer in an inert gas atmosphere or in a vacuum atmosphere.

9. The method according to claim 8, wherein the first electrode is an anode, the second electrode is a cathode, and the functional organic material contains a hole transporting macromolecular compound.

10. The method according to claim 9, wherein the above-mentioned hole transporting macromolecular compound is at least one kind selected from the group consisting of polyvinylcarbazole or its derivatives, polysilane or its derivatives, polysiloxane derivatives having an aromatic amine compound group in their side chain or main chain, polyaniline or its derivatives, polythiophene or its derivatives, polyarylamine or its derivatives, poly(p-phenylenevinylene) or its derivatives, and poly(2,5-thienylenevinylene) or its derivatives.

* * * * *